United States Patent [19]
Itoh et al.

[11] Patent Number: 5,239,702
[45] Date of Patent: Aug. 24, 1993

[54] TUNING DETECTOR

[75] Inventors: Masashi Itoh, Yokohama; Shuji Watanabe, Kawasaki, both of Japan

[73] Assignee: Kabushiki Kaisha Toshiba, Kanagawa, Japan

[21] Appl. No.: 690,922

[22] PCT Filed: Oct. 17, 1990

[86] PCT No.: PCT/JP90/01335
§ 371 Date: Jun. 14, 1991
§ 102(e) Date: Jun. 14, 1991

[87] PCT Pub. No.: WO91/06150
PCT Pub. Date: May 2, 1991

[30] Foreign Application Priority Data
Oct. 17, 1989 [JP] Japan ................................. 1-269664

[51] Int. Cl.⁵ .............................................. H04B 1/16
[52] U.S. Cl. ................................ 455/194.1; 455/212; 455/214
[58] Field of Search ............... 455/192.3, 194.2, 195.1, 455/212, 214, 194.1

[56] References Cited
U.S. PATENT DOCUMENTS
4,112,371 9/1978 Ogita ..................... 455/212
4,398,060 8/1983 Ienaka et al. ............. 455/194.1

FOREIGN PATENT DOCUMENTS
57-041043 3/1982 Japan .
58-164329 9/1983 Japan .

Primary Examiner—Reinhard J. Eisenzopf
Assistant Examiner—Nguyen Vo
Attorney, Agent, or Firm—Finnegan, Henderson, Farabow, Garrett & Dunner

[57] ABSTRACT

This present invention relates to a tuning detector used for an FM receiver, and it has a mute band detecting function to solve a problem in relation to setting of a ratio of a tuning detection band to a non-mute band. For this reason, a resistor for setting a band to be detected is connected between one terminal of a capacitor for removing an AC signal included in an FM detection signal and one terminal of the power source for applying a reference voltage. The input terminal of a first buffer circuit is connected to the connection point of the resistor and the capacitor, and the second buffer circuit is connected to the connection point of the power source and the resistor. A tuning band detecting section for detecting a tuning band is connected to the output terminals of the first and second buffer circuits. A detuning mute band detecting section for detecting a detuning mute band is connected between an arbitrary dividing point of the resistor and the above one terminal of the power source. The mute circuit controls the gain of the amplifier for amplifying an FM detection signal in response to an output signal from the detuning mute band detecting section.

15 Claims, 3 Drawing Sheets

TUNING DETECTOR

The present invention relates to a tuning detector used for, e.g., an FM receiver, and having a mute band detecting function for detecting a mute band when a signal is detuned.

BACKGROUND OF THE INVENTION

FIG. 4 shows a conventional tuner.

An input terminal 11 couples an FM intermediate-frequency signal to an FM detector 12. The output terminal of the FM detector 12 is connected to amplifiers 13 and 14, and the output of the amplifier 14 is connected to an output terminal 15.

The output terminal of the amplifier 13 is grounded through a capacitor C1 for removing an AC signal and grounded through a resistor R11 and a reference voltage Vref. Transistors Q11, Q12, Q13 constitutes a detuning mute band detecting section that is connected across the two terminals of the resistor R11. To control the gain of the amplifier 14, the collector of the transistor Q12 is connected to a mute circuit 16 through transistors Q16, Q15, and Q14 and a resistor R12. In addition, the collector of the transistor Q12 is connected through a resistor R13 to a transistor Q17 to generate a tuning detection signal. The collector of the transistor Q17 is connected to a power source Vcc through a resistor R14 and to an output terminal 17 for the tuning detection signal.

With the above arrangement, an FM intermediate-frequency signal supplied to the input terminal 11 is detected by the FM detector 12. A detection output signal is amplified by the amplifier 13 and applied to the output terminal 15 through the amplifier 14.

The AC component of the output signal from the amplifier 13 is removed by the capacitor C1, and the DC part of the output signal is supplied to the resistor R11. When a voltage generated across two terminals A and B of the resistor R11 is lower than the voltages of the transistors Q11 and Q12, i.e., $\pm V_{BE}$, the transistors Q11 and Q12 are set in an OFF state. Therefore, the transistors Q17 and Q14 driven by the transistors Q11 and Q12 are set in an OFF state. For this reason, a high-level tuning detection signal is supplied to the output terminal 17, and the mute circuit 16 is not driven.

When the voltage between the terminals A and B of the resistor 11 is higher than the voltage $\pm V_{BE}$ of the transistor Q11 or Q12, the transistor Q11 or Q12 is turned on. Therefore, the transistor Q17 is turned on, and a low-level detuning detection signal is supplied to the output terminal 17. The transistor 14 is turned on to drive the mute circuit 16, and the detection output is attenuated.

In the above conventional tuning detecting circuit, the transistors Q17 and Q14 are driven by currents obtained by shunting the collector output current of the transistor Q11 or Q12 through the resistors R12 and R13. That is, the currents shunted by the resistors R12 and R13 are used to detect tuning and detuning and to drive the mute circuit 16. For this reason, when a ratio of a tuning detection band to a non mute band is set to be a predetermined ratio, e.g., if the resistance of the resistor R13 is decreased, the tuning detection band is narrowed, and the non-mute band is widened. Therefore, the band ratio cannot be easily set.

In addition, since an impedance from the resistor R13 to the transistor Q17 is different from an impedance from the resistor R12 to the transistor Q15, the band ratio is not easily set by a ratio of the resistor R13 to the resistor R12. The band ratio is influenced by a current amplification factor $\beta$, i.e., a base current value of the transistor Q17. For example, when the transistor Q17 is set in an ON state, the base current value is changed by the value of the resistor R14 for controlling the collector current of the transistor Q17. Therefore, the band width is influenced, and the band ratio is changed.

SUMMARY OF THE INVENTION

It is an object of the present invention to provide a tuning detecting circuit in which a ratio of a tuning detection band to a non-mute band can be easily set, and the band ratio is not influenced even when characteristics of transistors are not identical to each other.

The present invention is achieved by the following arrangement.

A tuning detector comprises a capacitor for removing an AC signal included in an FM detection signal and a power source for applying a reference voltage. A resistor, connected between one terminal of the power source and one terminal of the capacitor, sets a band to be detected.

A first detecting section is connected to both terminals of the resistor to detect a tuning band, and a second detecting section is provided to detect a detuning mute band in accordance with an arbitrary voltage divided by the resistor.

That is, according to the present invention, the tuning detecting section is arranged between the two terminals of the resistor to set the band to be detected, and the detecting section is arranged to detect the detuning mute band in accordance with the arbitrary voltage divided by the resistor. A ratio of a tuning detection band to a non-mute band can be accurately set by a ratio of resistances. In addition, since an input voltage to each detecting section can be determined by a ratio of resistances, an influence of an error of a circuit element can be eliminated.

BRIEF DESCRIPTION OF DRAWINGS

The accompanying drawings, which are incorporated in and constitute a part of this specification, illustrate one embodiment of the invention and together with the description provide an explanation of the objects, advantages and principles of the invention. In the drawings.

DESCRIPTION OF THE PREFERRED EMBODIMENT

Figure 1:
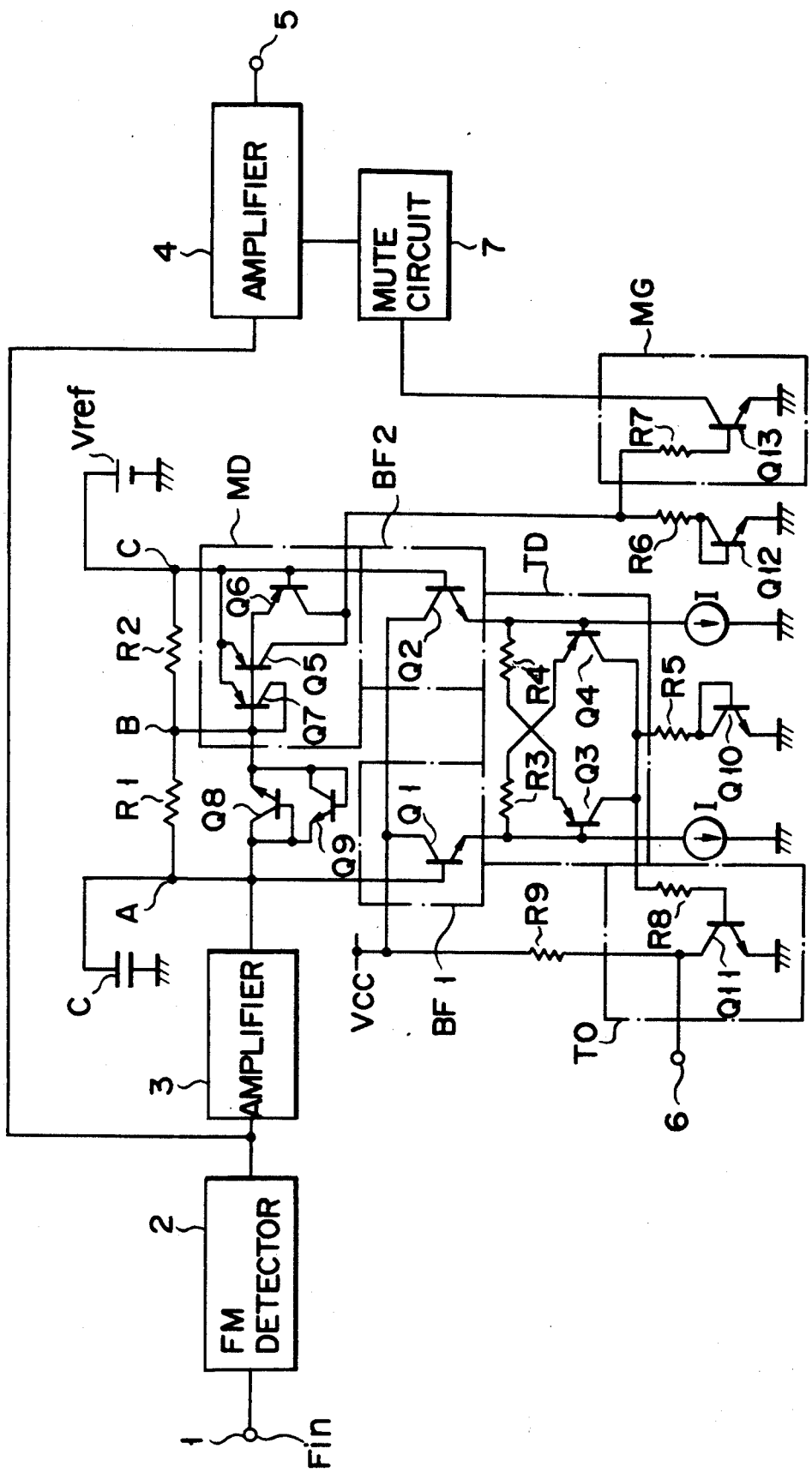
FIG. 1 is a circuit diagram showing a tuning detector according to an embodiment of the present invention.

In FIG. 1, an input terminal 1 for receiving an FM intermediate-frequency signal Fin is connected to an FM detector 2. The output terminal of the FM detector 2 is connected to amplifiers 3 and 4. The output terminal of the amplifier 4 is connected to an output terminal 5.

The output terminal of the amplifier 3 is grounded through a capacitor C for removing an AC signal and grounded sequentially through resistors R1 and R2 for setting a band to be detected and a reference voltage Vref. In addition, transistors Q8 and Q9, each of which has a base and a collector connected to each other to serve as a diode, and which constitute a limiter, are connected between two terminals A and B of the resistor R1.

Transistors Q7, Q5, and Q6 constituting a detuning mute band detecting section MD are connected between two terminals B and C of the resistor R2. That is, the bases of the transistors Q7 and Q5 and the emitter of the transistor Q6 are connected to a connection point B of the resistors R1 and R2. The collector of the transistor Q7 is connected to its base, the emitters of the transistors Q7 and Q5 are connected to the base of the transistor Q6 and to a connection point C of the resistor R2 and the reference voltage Vref. The collector of the transistor Q6 is connected to the collector of the transistor Q5.

Note that the detuning mute band detecting section MD may be connected between the two terminals A and B of the resistor R1, and the transistors Q8 and Q9 constituting the limiter circuit may be connected between the two terminals B and C of the resistor R2.

The base of a transistor Q1 having a high-input impedance is connected to the connection point A and the base of the the transistor Q2 is connected to the connection point C of the resistor R2 and the reference power source Vref, and the emitters of the transistors Q2 and Q1 are respectively grounded through a constant current source I.

The emitter of the transistor Q1 is connected to the emitter of a transistor Q4 through a resistor R3. The base of the transistor Q4 is connected to the emitter of the transistor Q2 and to the emitter of a transistor Q3 through a resistor R4. The base of the transistor Q3 is connected to the emitter of the transistor Q1, and the collector of the transistor Q3 is grounded with the collector of the transistor Q4 through a diode-connected transistor Q10 and a resistor R5. These transistors Q3 and Q4 and the resistors R3 and R4 constitute a tuning band detecting section TD, and the resistor R5 and the transistor Q10 are arranged to reliably operate a transistor Q11.

In addition, the collectors of the transistors Q3 and Q4 are connected to the base of the transistor Q11 through a resistor R8. The emitter of the transistor Q11 is grounded, and the collector of the transistor Q11 is connected to the power source Vcc through a resistor R9 and to a tuning/detuning output terminal 6. The resistor R8 and the transistor Q11 constitute a tuning detection signal output section T0.

The collectors of the transistors Q5 and Q6 are grounded through a resistor R6 and a diode-connected transistor Q12 and to the base of a transistor Q13 through a resistor R7. The emitter of the transistor Q13 is grounded, and the collector of the transistor Q13 is connected to a mute circuit 7. The resistor R7 and the transistor Q13 constitute a detuning mute signal generator MG. The mute circuit is connected to the amplifier 4, and the gain of the amplifier 4 is decreased to attenuate the detection output by the mute circuit 7.

Figure 2:
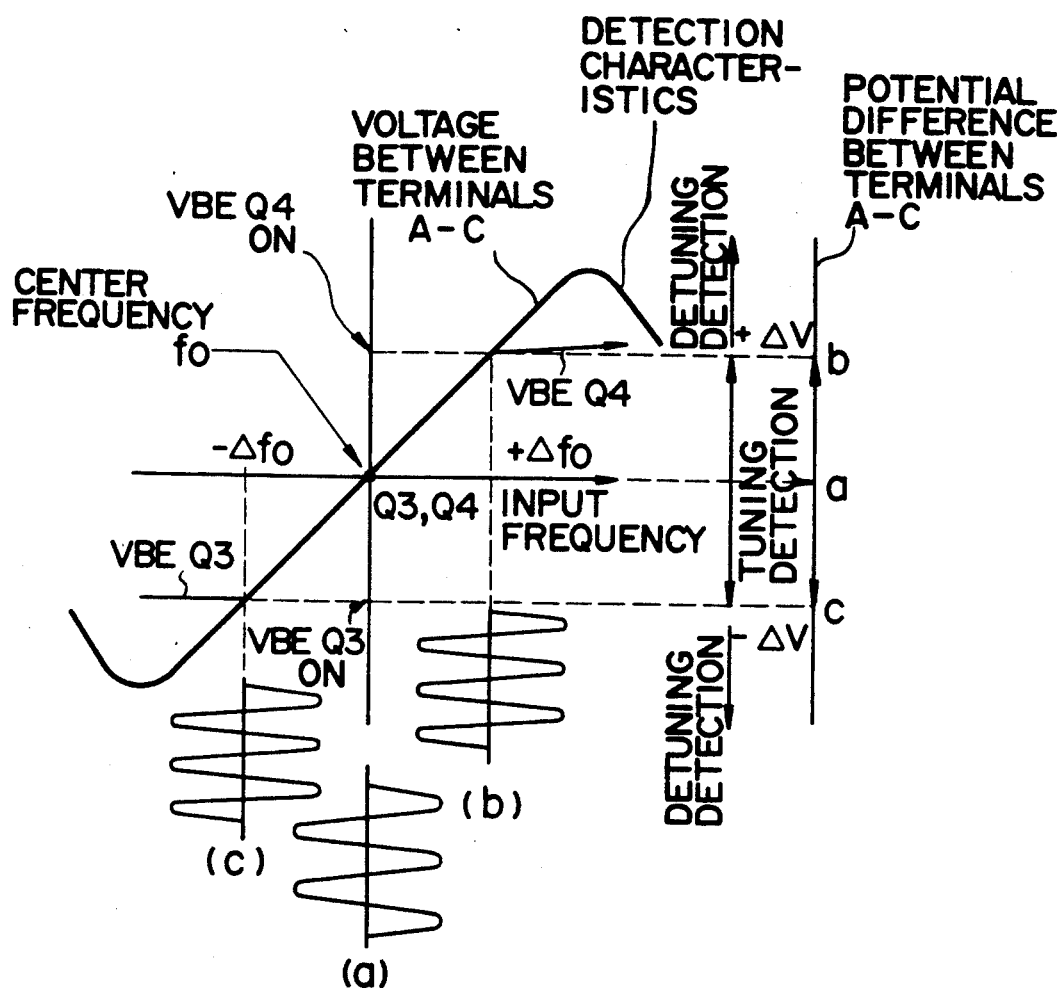
FIGS. 2 and 3 are graphs for explaining an operation of the tuning detector in FIG. 1.

An operation of the tuning detector with the above arrangement will be described below with reference to FIGS. 2 and 3.

When a signal having a frequency having a range of $\pm \Delta fo$ from a center frequency fo (10.7 MHz) is input to the FM detector 2 through the input terminal 1, a potential difference of $\pm \Delta V$ is generated across the two terminals A and C of the resistors R1 and R2 proportionally to the output signals from the FM detector 2 and the amplifier 3. The potential difference $\pm \Delta V$ is transferred to the transistors Q3 and Q4 through the transistors Q1 and Q2. In this case, when a relationship between the potential difference $\pm \Delta V$ and voltages $V_{BE}$ of transistors Q3 and Q4 is given by relation (1), $$|\pm \Delta V| \geq V_{BE}Q3(on), V_{BE}Q4(on) \quad (1)$$

the transistor Q3 or Q4 is turned on, the transistor Q11 is driven by the collector current of the transistor Q3 or Q4, and a detuning detection signal of low level is output from the tuning/detuning output terminal 6.

When the above condition is given by relation (2), $$|\pm \Delta V| < V_{BE}Q3(on), V_{BE}Q4(on) \quad (2)$$

the transistors Q3 and Q4 are set in an OFF state. Therefore, the transistor Q11 is set in an OFF state, and a tuning detection signal of high level is output from the tuning/detuning output terminal 6.

When the detuning detection signal is output, a potential between the emitter of the transistor Q1 (Q2) and the base of the transistor Q4 (Q3) is substantially equal to a potential $V_{BE}Q4(on)$ ($V_{BE}Q3(on)$), and the potential is equal to a potential $|\pm \Delta V|$ across the two terminals A and C of the resistors R1 and R2.

In this state, since a potential between the two terminals C and B of the resistor R2 is obtained by dividing a potential $|\pm \Delta V|(V_{BE}Q4(on), V_{BE}Q3(on))$ by the resistors R1 and R2, it is smaller than the potential $V_{BE}(on)$. Therefore, the transistors Q5 to Q7 constituting the detuning band detecting section MD are still set in an OFF state, and the mute circuit 7 is not driven.

The detuning is advanced from the above state to increase the frequency $\pm \Delta f$, and the potential between the terminals C and B of the resistor R2 exceeds a potential for turning on the transistor Q5, i.e., a potential $V_{BE}Q5(on)$, or a potential for turning on the transistor Q6, i.e., a potential $V_{BE}Q6(on)$. At this time, the transistor Q5 or Q6 is turned on. For this reason, the transistor Q13 is turned on by a collector current of the transistor Q5 or Q6. Therefore, the mute circuit 7 is driven to decrease the gain of the amplifier 4, thereby attenuating the detected output.

A ratio of a tuning detection band to a non-mute band will now be described.

When a potential difference $\pm \Delta V$ is generated across the two terminals A and C of the resistors R1 and R2 in response to an output signal from the amplifier 3, a tuning state is given by relation (3):

$$|\pm \Delta V| < V_{BE}Q3(on), V_{BE}Q4(on) \quad (3)$$

and a detuning state is given by relation (4):

$$|\pm \Delta V| \geq V_{BE}Q3(on), V_{BE}Q4(on) \quad (4)$$

On the other hand, the potential difference between the two terminals A and C of the resistors R1 and R2 when a signal is detuned to be muted is represented by $\pm \Delta V_1$, $$|\pm \Delta V_1| \cdot R2/(R1+R2) \geq V_{BE}Q5(on), V_{BE}Q6(on) \quad (5)$$

When relation (5) is satisfied, the transistor Q5 or Q6 is turned on, and the mute circuit 7 is driven through the detuning mute signal generator MG.

Since a ratio of the tuning detection band to a non-mute band is equal to a ratio of the potential difference $|\pm \Delta V|$ between the two terminals A and C for tuning the transistors Q3 and Q4 to the potential difference $|\pm\Delta V_1|$ between the two terminals A and C for turning on the transistors Q5 and Q6, when $$V_{BE}Q3(on) = V_{BE}Q4(on) = V_{BE}Q5 = V_{BE}Q6(on),$$

non-mute band/tuning detection band $$= |\pm\Delta V_1|/|\pm\Delta V|$$

$$= 1 + R1/R2 \quad (6)$$

and the ratio of the tuning detection band to the non-mute band is determined by the ratio of the resistor R1 to the resistor R2. Therefore, a detection band ratio can be accurately determined. In addition, since the detection band ratio is determined by a resistance ratio, it is easily influenced by an error of a current amplification factor $\beta$ of a transistor.

Figure 3:
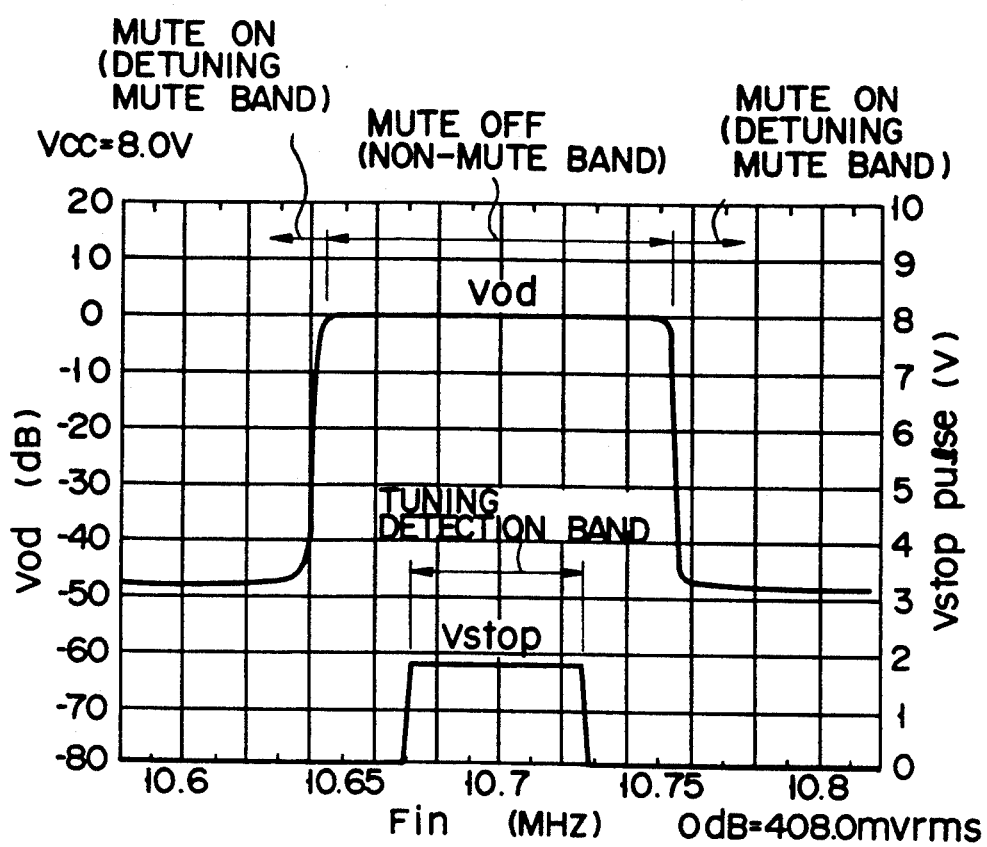
Figure 4:
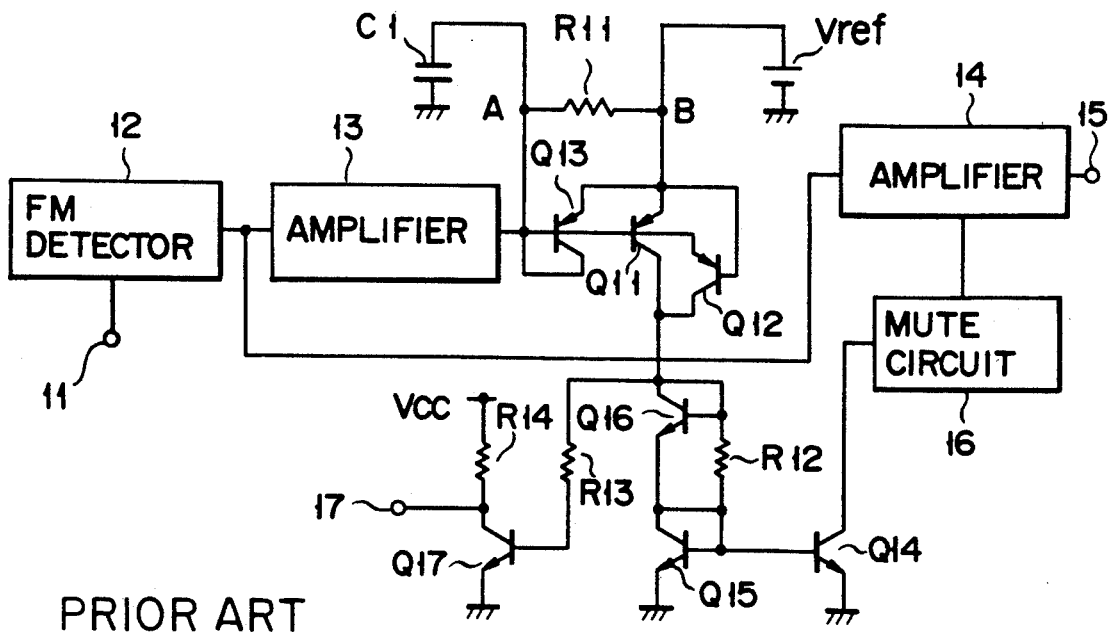
FIG. 4 is a circuit diagram showing a conventional prior art tuning detector.

FIG. 3 shows the characteristics of the tuning detection band, the detuning mute band, and non-mute band when R1/R2 = 1, i.e., the band ratio is set to be "2".

With the above embodiment, the tuning band detecting section TD for detecting the tuning band is arranged between the resistors R1 and R2, and the detuning mute band detecting section MD for detecting the detuning mute band is arranged between the two terminals of the resistor R2. Therefore, the ratio of the non-mute band to the tuning detection band of the detecting section MD can be accurately set by the ratio of the resistance of the resistor R1 to the resistance of the resistor R2.

In addition, since the input voltage of the detuning mute band detecting section MD can be determined by the ratio of the resistor R1 to the resistor R2, an error which occurs in the band ratio due to a variation in the current amplification factor $\beta$ can be prevented.

Note that the present invention is not limited to the above embodiment, and various modifications can be made without departing from the spirit and scope of the invention.

INDUSTRIAL APPLICABILITY

As is described above, according to the present invention, a ratio of a tuning detection band to a non-mute band can be accurately set by a ratio of resistances. In addition, since an input voltage of a detecting section for detecting a detuning mute band can be determined by a ratio of resistances, an error which occurs in the band ratio due to an error of a circuit element can be prevented. Therefore, the tuning detector of the present invention is effectively utilized as an FM tuning detector, and its industrial applicability is high.

We claim:

1. A tuning detector comprising:
   means having one terminal supplied with an FM detection signal, for removing an AC signal included in the FM detection signal;
   a power source for applying a reference voltage,
   a resistor means having end terminals connected to said one terminal of said power source and one terminal of said removing means for setting a band to be detected;
   a tuning detecting means, coupled across the end terminals of said resistor means, for detecting a tuning band; and
   a detuning mute band detecting means, connected across an intermediate point of the resistor means and one of said end terminals of the resistor means, for detecting a detuning mute band in accordance with a voltage divided by said resistor.

2. A tuning detector according to claim 1, further comprising: an amplifying means for amplifying the FM detection signal and outputting the amplified signal to an output terminal, and a mute circuit for controlling a gain of said amplifying means in response to an output signal from said detuning mute band detecting means.

3. A tuning detector comprising:
   means having one terminal supplied with an FM detection signal, for removing an AC signal included in the FM detection signal;
   a power source for applying a reference voltage;
   a resistor means, connected between one terminal of said power source and one terminal of said one removing means, for setting a band to be detected;
   a first buffer circuit having an input terminal connected to said one terminal of said removing means;
   a second buffer circuit having an input terminal connected to said one terminal of said power source;
   a tuning band detection means, connected to output terminals of said first and second buffer circuits, for detecting a tuning band; and
   a detuning mute band detecting means, connected between an intermediate point of said resistor means and said one terminal of said power source, for detecting a detuning mute band.

4. A tuning detector according to claim 3, further comprising: an amplifying means for amplifying the FM detection signal and outputting the amplified signal to an output terminal, and a mute circuit for controlling a gain of said amplifying means in response to an output signal from said detuning mute band detection means.

5. A tuning detector according to claim 3, wherein said first buffer circuit is constituted by a first transistor having a base connected to the connection point of said removing means and said resistor.

6. A tuning detector according to claim 3, wherein said second buffer circuit is constituted by a second transistor having a base connected to the connection point of said power source and said resistor.

7. A tuning detector according to claim 3, wherein said first buffer circuit is constituted by a first transistor having a base connected to the connection point of said removing means and said resistor, said second buffer circuit is constituted by a second transistor having a base connected to the connection point of said power source and said resistor, and said tuning band detecting means is constituted by third and fourth transistors having bases connected to emitters of said first and second transistors and a fifth transistor having a base connected to collectors of said third and fourth transistors.

8. A tuning detector according to claim 3, wherein said detuning mute band detecting means is constituted by a sixth transistor having a base connected to the intermediate point of said resistor and a seventh transistor having a base connected to said one terminal of said power source.

9. A tuning detector comprising:
   a capacitor having one terminal supplied with an FM detection signal, for removing an AC signal included in the FM detection signal;
   a power source for applying a reference voltage;
   a resistor means, connected between one terminal of said power source and said one terminal of said capacitor, for setting a band to be detected;

a first high-input-impedance buffer circuit having an input terminal connected to said one terminal of said capacitor;

a second high-input impedance buffer circuit having an input terminal connected to said one terminal of said power source;

a tuning band detecting means, connected to output terminals of said first and second buffer circuits, for detecting a tuning band;

a detuning mute band detection means, connected between an intermediate point of said resistor means and said one terminal of said power source, for detecting a detuning mute band;

an amplifying means for amplifying the FM detection signal and outputting the amplified signal to an output terminal; and a mute circuit for controlling a gain of said amplifying means in response to an output signal from said detuning mute band detecting means.

10. A tuning detector according to claim 9, wherein said first buffer circuit is constituted by a first transistor having a base connected to said one terminal of said capacitor.

11. A tuning detector according to claim 9, wherein said second buffer circuit is constituted by a second transistor having a base connected to said one terminal of said power source.

12. A tuning detector according to claim 9, wherein said first buffer circuit is constituted by a first transistor having a base connected to said one terminal of said capacitor, said second buffer circuit is constituted by a second transistor having a base connected to said one terminal of said power source, and said tuning band detecting means is constituted by third and fourth transistors having bases connected to emitters of said first and second transistors and a fifth transistor having a base connected to collectors of said third and fourth transistors.

13. A tuning detector according to claim 9, wherein said detuning mute band detecting means is constituted by a sixth transistor having a base connected to the intermediate point of said resistor and a seventh transistor having a base connected to said one terminal of said power source.

14. A tuning detector comprising:

a capacitor, having one terminal supplied with an FM signal, for removing an AC signal included in the FM detection signal;

a power source for applying a reference voltage;

a resistor means, connected between one terminal of said power source and said one terminal of said capacitor, for setting a band to be detected;

a first buffer circuit having an input terminal connected to said one terminal of said capacitor;

a second buffer circuit having an input terminal connected to said one terminal of said power source;

a tuning band detecting means, connected to output terminals of said first and second buffer circuits, for detecting a tuning band; and a detuning mute band detecting means, connected between an intermediate point of said resistor means and one of said terminals of said resistor.

15. A tuning detector comprising:

a first amplifying means for amplifying an FM detecting signal;

a capacitor for removing an AC signal included in an output signal outputted from said first amplifying means;

a power source for applying a reference voltage;

a resistor means, connected between one terminal of said power source and one terminal of said capacitor, for setting a band to be detected;

a first high-input-impedance buffer circuit having an input terminal connected to said one terminal of said capacitor;

a second high-input-impedance buffer circuit having an input terminal connected to said one terminal of said power source;

a tuning band detecting means, connected to output terminals of said first and second buffer circuits, for detecting a tuning band; 'a detuning mute band detecting means, connected between an intermediate point of said resistor means and said one terminal of said power source, for detecting a detuning mute band;

a second amplifying means for amplifying the FM detection signal and outputting the amplified signal to an output terminal; and a mute circuit for controlling a gain of said second amplifying means in response to an output signal from said detuning mute band detecting means.

* * * * *